United States Patent
Palm

(10) Patent No.: US 12,080,569 B1
(45) Date of Patent: Sep. 3, 2024

(54) ENERGY-SAVING HEAT TREATMENT DEVICE FOR METAL SUBSTRATE IN CORROSIVE GAS

(71) Applicants: CNBM RESEARCH INSTITUTE FOR ADVANCED GLASS MATERIALS GROUP CO., LTD., Bengbu (CN); TRIUMPH SCIENCE & TECHNOLOGY GROUP CO., LTD., Beijing (CN)

(72) Inventor: Joerg Palm, Munich (DE)

(73) Assignees: CNBM RESEARCH INSTITUTE FOR ADVANCED GLASS MATERIALS GROUP CO., LTD., Bengbu (CN); TRIUMPH SCIENCE & TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/288,998

(22) PCT Filed: Jun. 23, 2022

(86) PCT No.: PCT/CN2022/100785
§ 371 (c)(1),
(2) Date: Oct. 31, 2023

(87) PCT Pub. No.: WO2023/245550
PCT Pub. Date: Dec. 28, 2023

(51) Int. Cl.
*H01L 21/67* (2006.01)
*H01L 21/324* (2006.01)

(52) U.S. Cl.
CPC ...... *H01L 21/67115* (2013.01); *H01L 21/324* (2013.01)

(58) Field of Classification Search
CPC .................. H01L 21/67115; H01L 21/324
See application file for complete search history.

(56) References Cited

U.S. PATENT DOCUMENTS

| | | | |
|---|---|---|---|
| 2011/0117693 A1 | 5/2011 | Palm et al. | |
| 2014/0061531 A1 | 3/2014 | Faur et al. | |

FOREIGN PATENT DOCUMENTS

| | | | |
|---|---|---|---|
| CN | 203038961 U | 7/2013 | |
| EP | 1258043 A2 | 11/2002 | |
| EP | 1277238 A2 | 1/2003 | |
| EP | 2291868 B1 | 4/2020 | |
| WO | 0129902 A2 | 4/2001 | |
| WO | 2011104231 A1 | 9/2011 | |
| WO | 2013120779 A1 | 8/2013 | |

*Primary Examiner* — Robert G Bachner
(74) *Attorney, Agent, or Firm* — Bayramoglu Law Offices LLC

(57) ABSTRACT

An energy-saving heat treatment device for a metal substrate in a corrosive gas includes a process frame located in a radiation field. A substrate is configured to be inserted in the process frame, and the process frame covers an outer edge of an upper surface of the substrate to form a process space having a small volume. The process frame is made on the basis of the modification to the structure of the original process frame. By covering the outer edge of the substrate, the edge is protected from contact with selenium, and chalcogen elements in contact with the edge are reduced, and even residual chalcogen elements or hydrocarbons in a chamber do not corrode the edge of the substrate. Since the process space is minimized, the chalcogenide elements in the process chamber are greatly reduced, and a barrier layer on a bottom side of the substrate is significantly thinned.

20 Claims, 5 Drawing Sheets

ENERGY-SAVING HEAT TREATMENT DEVICE FOR METAL SUBSTRATE IN CORROSIVE GAS

CROSS REFERENCE TO THE RELATED APPLICATIONS

This application is the national phase entry of International Application No. PCT/CN2022/100785, filed on Jun. 23, 2022, the entire contents of which are incorporated herein by reference.

TECHNICAL FIELD

The present invention relates to the technical field of rapid heat treatment of metal substrates, AND in particular to an energy-saving heat treatment device for a metal substrate in a corrosive gas.

BACKGROUND

A process box consists of a graphite or composite frame such as carbon fiber reinforced carbon (CFRC), reinforced carbon (RCC) or carbon fiber-carbon composite (CFC). Glass ceramic tiles have been shown to be resistant to high temperatures, insensitive to temperature gradients and to corrosion by selenium or sulfur, very low coefficient of expansion and high mechanical stability. Due to use of each 4 mm thick board alone, the mass of the boards is already four times that of the substrate. For a substrate with an area of about 1 $m^2$ (equivalent to 5 kg in a case of a thickness of 2 mm), the total weight of the box is about 40 kg. This "non-productive" substance is eventually heated to process temperature and must then be cooled again during the process.

The actual design and improvement of the volume-reduced reaction container concept and the construction of a production facility based thereon are described, for example, in EP1258043 (selection box) and EP1277238 (chamber structure of selection facility). Although graphite films are described as energy transmitters in EP1258043, the main claim always assumes a transparent body, especially a glass ceramic. Therefore, the energy transmitter is an additional layer or film that does not act as a cover or floor for a box.

In the catalogue of patents provided by J. Palm, M. Fürfanger, J. Baumbach and F. Karg on the subject matter of boxless RTP (apparatus and procedure for the treatment of indoor tempered objects), invention report EM2008 0002 (patent granted to EP2291868B1) discloses an alternative RTP procedure without use of a mobile P-box (process head). This method saves energy if the process shoe is no longer cooled in continuous operation. Only then, when the first heating is finished, the mass of the heating is much greater than that of the actual substrate. Since only the carrier and substrate are cooled, the required cooling performance is also reduced.

The actual design and improvement of the volume-reduced reaction container concept and the construction of a production facility based thereon are described, for example, in EP1258043 (selection box) and EP1277238 (chamber structure of selection facility). Although graphite films are described as energy transmitters in EP1258043, the main claim always assumes a transparent body, especially a glass ceramic. Therefore, the energy transmitter is an additional layer or film that does not act as a cover or floor for a box.

Alternatives to the process box process are the systems and processes that competitors are following or have already followed: the substrate is moved on rolls or in a process chamber (a chamber or a continuous channel). In this case, the gaseous selenium must be injected into a relatively large chamber (with conveying rollers) to generate the necessary selenium vapor pressure. However, CIGS/CIGSSE thin-film semiconductors and thin-film modules with similar efficiencies have not been produced according to these methods in large-scale production or in the laboratory. In addition, the consumption of chalcogens is usually very high because chalcogens are basically not limited to small processing quantities. This also increases the problem of deposits and corrosion.

SUMMARY

One of the objectives of the present invention is to overcome the above-mentioned deficiencies of the prior art, and to provide an energy-saving heat treatment device for a metal substrate in a corrosive gas. Its core is to make a further development in the existing AVANCIS program, so that the modified process frame has the advantages of no corrosion on the edge of the substrate during processing, high efficiency and low energy consumption and can effectively solve the problem that an IG or semiconductor stack cannot be produced on a metal substrate currently.

In order to achieve the above objective, the energy-saving heat treatment device for a metal substrate in a corrosive gas according to the present invention includes: a process chamber;

a radiation field, arranged in the process space to provide a heat source for the process space;

a process frame, arranged inside the process space to accommodate at least one substrate for a rapid heat treatment process, an upper surface of an outer edge of the substrate being covered on the process frame; and a cover, covering the top of the process frame to isolate a space above the substrate from the process chamber;

wherein the process frame, the substrate and the cover form a small process volume, and the small process volume reduces an amount of introduction and/or overflow of a process gas exchanged with the process chamber to a limit value.

The process frame is made on the basis of the modification to the structure of the original process frame. By covering the outer edge of the substrate, the edge can be protected from contact with selenium, and moreover chalcogen elements in contact with the edge can be reduced, and even residual chalcogen elements or hydrocarbons in the chamber will not corrode the edge of the substrate. Since the process space is minimized, the chalcogenide elements in the process chamber are greatly reduced, and a barrier layer on a bottom side of the substrate can also be significantly thinned.

In the context of the present invention, the term "radiation field" refers to a heated space formed by the heating radiation of an energy source in an RTP process, for example, a radiation source with transparent walls, such as a lamp. An object to be treated is placed in the chamber and irradiated with radiation from a radiation source, and then the object can be heated. It should be noted that a chamber with transparent walls is not absolutely necessary in the system, as long as the system controls an atmosphere in which the object is placed during treatment.

The term "process space" refers to the space in which the substrate is processed by the RTP process. Specifically, the above-mentioned space is the space in which the process frame covers the substrate in the radiation field.

As a further improvement of the above solution, the above-mentioned cover is configured as:
1) being located inside the radiation field and remains stationary; or
2) being located on the process frame and forming an integral structure with the process frame.

In the case of configuration 1) of the cover, the cover and the radiation field are of an integral structure. In this structure, the cover can be recycled, and one cover can correspond to multiple process frames, which achieves high utilization rate and reduced processing cost.

In the case of configuration 2) of the cover, the cover and the process frame are of an integral structure. In this structure, the cover and the process frame cooperate better. Each cover corresponds to an individual process frame, and the process effect is better.

As a further improvement of the above solution, the outer edge of the lower surface of the substrate (2) is covered in two modes:
Mode I): the process frame covers the outer edge of the lower surface of the substrate; or
Mode II) the substrate is in contact with a bottom surface of the radiation field so that the bottom surface of the radiation field covers the bottom surface of the substrate.

The two methods for covering the edge of the lower surface respectively correspond to covering by the process frame itself and covering by the bottom surface of the radiation field being in contact with the substrate. It should be noted that in Mode I), the substrate and the process frame are in plug-in fit, and the contact area between the edge of the substrate and the process frame is large, so the substrate and the process frame are fixed more securely; and in Mode II), the process frame does not have a bottom plate, so the overall structure of the process frame becomes simpler.

As a further improvement of the above solution, the cover is located between the two outer edges of the substrate, the covering area of the cover is within a range of 1 to 50 mm, and the cover is provided with a photoelectrically inert material. The covering area should be a minimum of 1 mm and a maximum of 50 mm from edge to interior. The range of 5 to 10 mm is probably the best choice, which on the one hand not loses too much space and on the other hand ensures a good airtightness of the edges. Moreover, in a subsequent process, this area can be used as a contact area for a busbar and can also be separated later.

As a further improvement of the above solution, the bottom plate is arranged under the substrate in two forms as follows:
Form a): the bottom plate supports the substrate and is located at the bottom end of the process frame and forms an integral structure with the process frame;
Form b): the bottom plate supports the substrate and is installed on the bottom surface of the radiation field.

In the case of form a), the bottom plate and the process frame are of an integral structure. In this structure, the bottom plate and the process frame cooperate better. Each cover corresponds to an individual process frame, and the process effect is better.

In the case of form (b) of the cover, the bottom plate and the radiation field are of an integral structure. In this structure, the cover can be recycled, and one bottom plate can correspond to multiple process frames, which achieves high utilization rate and reduced processing cost.

As a further improvement of the above solution, a sealing member for sealing an upper surface and/or a lower surface of the outer edge of the substrate is arranged in the outer edge of the substrate, so as to achieve the purpose of sealing the outer edge of the substrate.

As a further improvement of the above solution, the sealing member includes a material having a longitudinal expansion coefficient greater than that of the process frame, and the sealing member, the process frame and the substrate form a gap in a cold state. Specifically, when heated, the sealing member expands more than the process frame, and closes the above-mentioned gap, which helps to draw out the residual water vapor and oxygen.

As a further improvement of the above solution, the sealing member includes at least one or a combination of glass-ceramic, zirconia and magnesia.

As a further improvement of the above solution, the metal wire mesh is arranged on the lower surface of the substrate and substantially parallel to the substrate. The cross-section of the metal wire mesh is composed of circular or rectangular rods, and the minimum area of the metal wire mesh is parallel to a foil, and the substrate is supported by mechanical clamping, so as to reduce the permanent bending of the substrate due to elastic deformation at a high temperature.

As a further improvement of the above solution, the bottom plate includes at least one support rod, and the support rod may be made of opaque, partially transparent or transparent materials.

As a further improvement of the above solution, the bottom plate includes:
a first transmission plate;
a second transmission plate;
a spacer, configured to separate the first transmission plate from the second transmission plate and arranged on a peripheral edge of the first transmission plate and a peripheral edge of the second transmission plate;
a first spring, arranged between a bottom surface of the first transmission plate and the spacer; and
a second spring, arranged between a top surface of the second transmission plate and the spacer.

Due to use of the first spring and the second spring, an expansion space is formed between the first transmission plate and the spacer and between the second transmission plate and the spacer, so as to prevent the thermally expanded first transmission plate or second transmission plate from fracturing due to the narrowed space.

As a further improvement of the above solution, the first spring is located at a position adjacent to the peripheral edge of the first transmission plate, and the second spring is located at a position adjacent to the peripheral edge of the second transmission plate.

As a further improvement of the above solution, each of the first spring and the second spring includes a superalloy. The superalloy is selected because the superalloy is non-magnetic, presents high strength, and maintains excellent formability, excellent corrosion resistance and high fatigue strength. On the one hand, the chalcogenide gas can be prevented from corroding the two springs in the expansion spaces. On the other hand, since the service life of the superalloy is relatively long, the actual service life of the bottom plate is prolonged.

As a further improvement of the above solution, the above-mentioned superalloy includes cobalt, chromium, nickel and molybdenum.

As a further improvement of the above solution, the first transmission plate is provided with a plurality of vent holes for gas to pass into a gas storage space.

As a further improvement of the above solution, the first spring includes a coil spring, and the coil spring is in contact with the bottom surface of the first transmission plate adjacent to the peripheral edge of the first transmission plate; the second spring includes a coil spring, and the coil spring is in contact with the top surface of the second transmission plate adjacent to the peripheral edge of the second transmission plate.

As a further improvement of the above solution, the above-mentioned gap includes:
a hollow body, positioned on a top surface and/or a bottom surface of the gap, the hollow body being implemented as an inner metal wall and a cavity, a first filler being arranged to block a connection opening between the cavity and the gap in the cavity, the first filler shrinking and opening the connection opening as the temperature rises. In a heated state, the gap comes into communication with the cavity. In this state, the hollow body forms a suction cup structure, so that the substrate can be fixed more securely. Moreover, in combination with a sealing member, the content of chalcogen elements in the gap can be reduced.

As a further improvement of the above solution, the first filler has a shrunken tip, and the tip of the first filler is located at the connection opening. During the shrinking process, no matter whether the tip of the first filler shrinks radially or laterally, the gas passage can come into communication faster.

As a further improvement of the above solution, the first filler includes ceramic fibers, and the ceramic fiber material has excellent thermal shrinkage property, so as to achieve the purpose of rapidly shrinking the first filler at a high temperature.

As a further improvement of the above solution, the chalcogenide filter is configured at the connection opening. In this way, the purpose of filtering the chalcogen elements in the gas entering the cavity can be reached and the primary filtration of the chalcogen elements can be achieved.

As a further improvement of the above solution, the cavity is provided with a desulfurization space for storing a desulfurization gas. After being sucked in, the gas is desulfurized through the desulfurization space to reduce the chalcogen elements in the gas in the gap and the desulfurization space.

As a further improvement of the above solution, the above-mentioned desulfurization gas is an alkaline gas, and preferably, the alkaline gas may be ammonia gas.

As a further improvement of the above solution, a stopper is arranged between the first filler and the cavity. In this embodiment, the desulfurization space is in a degassed state after being heated, so that the desulfurization gas enters the gap, and after the gas passage comes into communication, the desulfurization space on two sides forms a structure similar to a syringe under the action of the inner metal wall and a second filler, so as to implement the push-out action of the desulfurization gas. In this process, by injecting desulfurization gas into the gap, the gas desulfurization action in the gap can be completed to the maximum extent.

As a further improvement of the above solution, a limit space for the first filler to move linearly is formed between the two inner metal calls, and the desulfurization space is located on the other side of the inner metal wall. Moreover, the inner metal wall is an accessory with good thermal conductivity. On the one hand, during the heating process, the inner metal wall can better conduct heat to the first filler. On the other hand, the first filler and the second filler are restricted to shrink in a linear direction, so as to better separate the first filler from the connection opening.

As a further improvement of the above solution, the connection opening is sequentially provided with an inlet section, a convergent section, a throat and a diffusion section along an inlet direction to form a Venturi tube type gas passage that is easy for the gas to flow into the gap from the cavity. Utilizing the advantage of the Venturi tube structure producing little resistance to the fluid, gas can easily flow into the gap, and moreover blockage hardly occurs after long-term use, and thus the service life of the above-mentioned process frame is prolonged.

As a further improvement of the above solution, the second filler includes a heat-conducting balloon and a thermally expandable fluid. The fluid in combination with the heat-conducting balloon forms a thermal deformation structure that is likely to expand and shrink with temperature. On the one hand, the thermal deformation structure has a long service life. On the one hand, the second filler is hardly damaged during thermal deformation.

With reference to the following description and drawings, specific embodiments of the present invention are disclosed in detail, indicating the manner in which the principles of the present invention may be employed. It should be understood that the embodiments of the present invention are not thereby limited in scope. Embodiments of the invention include many changes, modifications and equivalents within the spirit and scope of the appended claims.

In the figures: 1. process frame; 2. substrate; 3. cover; 4. bottom plate; 5. sealing member; 6. gap; 7. hollow body; 11. accommodating space; 41. first transmission plate; 42. second transmission plate; 43. spacer; 44. first spring; 45. second spring; 46. gas storage space; 71. inner metal wall;

72. cavity; 73. first filler; 74. gas passage; 75. chalcogenide filter; 76. desulfurization space; 77. second filler; 411. vent hole.

DETAILED DESCRIPTION OF THE EMBODIMENTS

In order to make the objectives, technical solutions and advantages of the present invention clearer, the present invention will be further described in detail below with reference to the accompanying drawings and embodiments. However, it should be understood that the specific embodiments described herein are only used to explain the present invention, and not to limit the scope of the present invention.

It should be noted that, when an element is referred to as being "arranged on or provided with" another element, it can be directly on the other element or there may be an intermediate element. When an element is referred to as being "connected to or connected with" another element, it can be directly connected to another element or there may be an intermediate element at the same time. "Fixed connection" means being fixedly connected, there are many ways of fixed connection, which is not within the scope of this disclosure. The terms "vertical," "horizontal," "left," "right," and similar expressions used herein are for illustrative purposes only and do not represent the unique embodiment.

Figure 1:
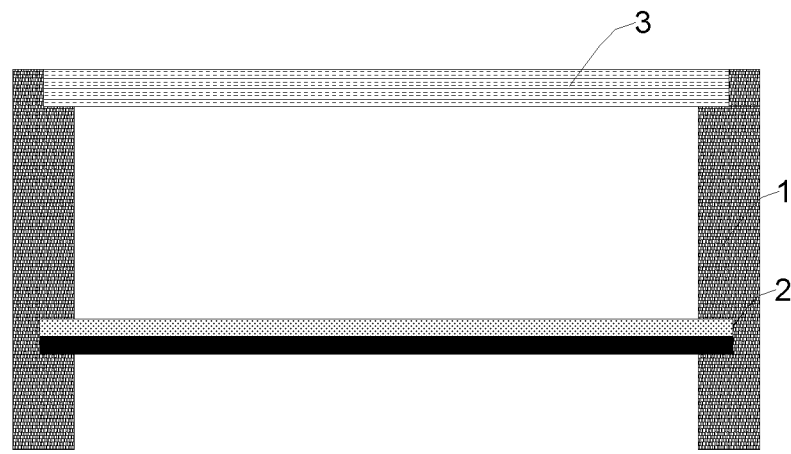
FIG. 1 is a schematic structural diagram of a process frame with a cover inserted from the left side according to the present invention.
Figure 2:
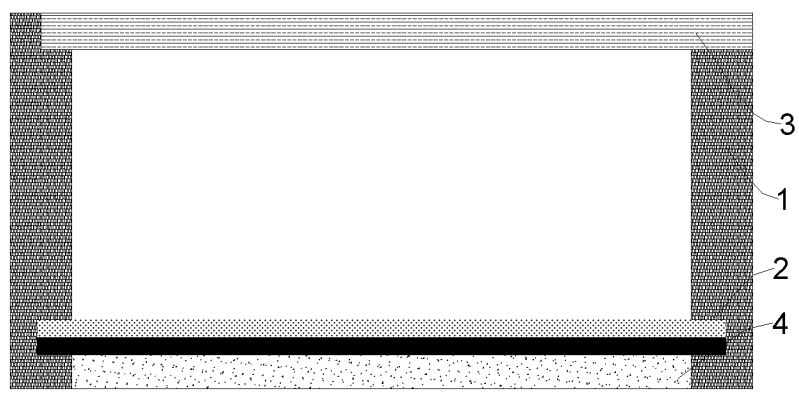
FIG. 2 is a schematic structural diagram of a process frame with a cover inserted from the left side according to the present invention in a case of a bottom plate provided.

Unless otherwise defined, all technical and scientific terms used herein have the same meaning as commonly understood by one of ordinary skill in the technical field of the present invention, and the terms used in the description are only for the purpose of describing specific embodiments, not for the purpose of limiting the present invention, the term "and/or" as used herein includes any and all combinations of one or more of the associated items listed;

The present invention is described in detail with the accompanying drawings of the description. The energy-saving heat treatment device for a metal substrate in a corrosive gas is shown in FIG. 1 and FIG. 2 according to an embodiment of the present invention. On the basis of the frame structure of an existing process box, in order to achieve the additional function of edge protection, the substrate 2 (i.e., a steel plate or a foil) is inserted into the process frame 1 to protect its edges from contact with selenium. Therefore, the parts of the process frame 1 must cover its surface and the lower surface of the substrate 2, the process frame 1 forms an open area, and evaporated chalcogen or additional $H_2S$ will affect the open area. In the coverage area along the edge, only trace amounts of chalcogens (Se, S) or chalcogenide hydrocarbons ($H_2Se$, $H_2S$) take effect. By similarly shielding the edges from below, even residual chalcogenides or hydrocarbons in the chamber will not cause corrosion to the edges. On the one hand, by covering the outer area of the substrate 2 back to the process frame 1, the entry of chalcogens from the bottom to the edge of the substrate 2 can be ensured. Since the process space is minimized and the chalcogen concentration in the process chamber has been greatly reduced, a barrier layer on the bottom surface of the substrate 2 can be significantly thinned.

The edge of the lower surface of the substrate (2) is covered by two methods:
   Mode I): the process frame 1 covers the outer edge of the lower surface of the substrate 2; or
   Mode II): the substrate 2 is in contact with a bottom surface of the radiation field so that the bottom surface of the radiation field covers the bottom surface of the substrate 2.

It can be seen from the above structure that the smallest process space for the substrate 2 is formed by the process frame 1, the cover 3 and the substrate 2. The cover 3 is configured on the process frame 1 and forms, together with the process frame 1 and the substrate 2, a gas shielding space for isolate the gas within the radiation field.

Figure 3:
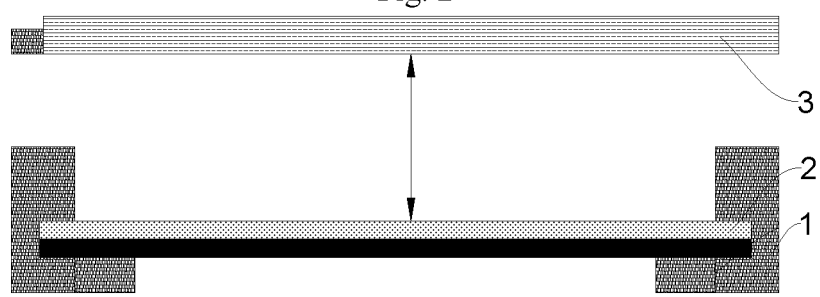
FIG. 3 is a schematic structural diagram showing the cover vertically translated by a variable according to the present invention in a case of no bottom plate.
Figure 4:
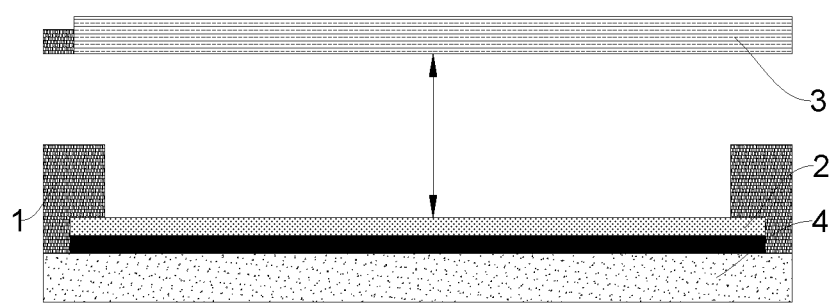
FIG. 4 is a schematic structural diagram showing the cover vertically translated by a variable according to the present invention in a case of a bottom plate provided.

In the case of a mobile process frame, the cover functions as a cover for the process frame, and the cover is inserted in or placed on the process frame (see FIGS. 3 and 4). For a fixed process head, the cover remains on the process frame, and the process frame and the cover are converted into a process space with reduced volume through vertical translation. FIG. 3 shows the variable in the case of no bottom plate, and FIG. 4 shows the variable in the case of a bottom plate provided. For example, FIG. 4 can also show the case where the process frame is placed on the bottom plate.

More specifically, the above-mentioned cover 3 is configured as:
   1) being located inside the radiation field and remaining stationary; or
   2) being located on the process frame and forming an integral structure with the process frame 1. The cover 3 can be inserted into the process frame 1, or from edge to interior of the process frame 1, the covering area should be a minimum of 1 mm and a maximum of 50 mm. The range of 5 to 10 mm is probably the best choice, which on the one hand not loses too much space and on the other hand ensures a good airtightness of the edges. In addition, the above-mentioned area does not have photoelectric activity. For example, in the subsequent process, the above-mentioned area can be used as a contact area for a busbar, and can also be separated later.

A bottom plate 4 for supporting the substrate 2 and preventing the substrate 2 from being corroded by a corrosive gas is configured below the substrate 2.

Regarding the bottom plate 4, further development is made on the basis of the structure of the process frame 1. The above-mentioned process frame 1 with the substrate 2 and the cover 3 can already form the smallest process space. That is, with regard to chalcogenide control, the bottom plate 4 is no longer required, and the elimination of the bottom plate 4 also has the advantage of significantly reducing the thermal mass, in addition to reducing the asymmetry of heating. However, the state-of-the-art technology of the process frame 1 achieves heat supply from above only by radiation (radiation of a heat sink and the cover heated indirectly by the heat sink). The heat from below is partly conducted by the physical contact between the bottom plate 4 and the substrate 2, and partly by thermal radiation, and this leads to complex time dynamic changes, which can only be partially compensated by the different current radiations from the above and the below.

Figure 6:
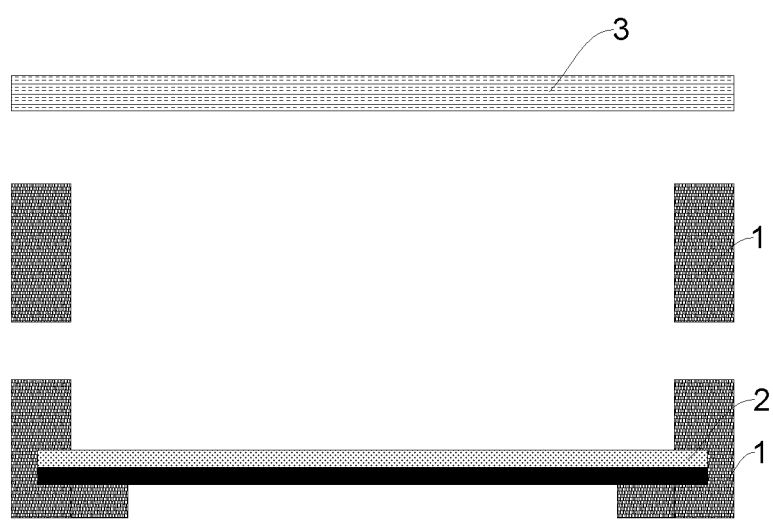
FIG. 6 is a schematic structural diagram of a second design of the process frame in a separation state according to the present invention.

Regarding the bottom plate 4, there are also two other designs different from the above-mentioned ways in the present invention, that is, the process frame 1 and the bottom plate 4 are of a separate configuration structure, specifically in two forms as follows;
   a) Referring to FIG. 5, the above-mentioned bottom plate 4 remains intact, and the bottom plate 4 further supports the substrate 2. For example, the bottom plate 4 is made of one or more of glass-ceramic, borosilicate glass, CFK and graphite. The bottom plate 4 itself provides the protection from corrosive gases. In this case, sealing is no longer required, and the bottom plate 4 is embedded in the process frame 1 or the process frame 1 is installed on the bottom plate 4. Certainly, the bottom plate 4 can also be a curved film added in the process frame 1 or reinforced with a supporting element.

b) Referring to FIG. 6, the bottom plate 4 remains intact and is located in the radiation field. In this structure, the bottom plate 4 can be recycled, and one bottom plate 4 can correspond to multiple process frames 1, thus achieving a high utilization rate and reducing the processing cost.

Regarding the process frame 1, unlike the process box in the prior art, the substrate 2 is always smaller than the box frame. The present invention adopts the following ways to insert the substrate 2 into the process frame 1.

Figure 5:
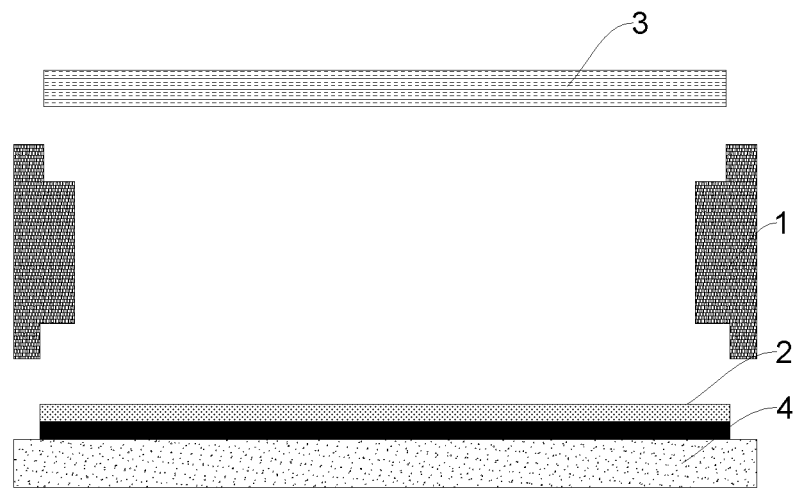
FIG. 5 is a schematic structural diagram of a first design of the process frame in a separation state according to the present invention.

In some examples, two possible designs of the process frame 1 are shown with reference to FIGS. 5 and 6. The process frame 1 is composed of at least two separable parts. In this case, the process frame 1 is composed of at least two separable parts. The bottom plate 2 is inserted or placed in a lower frame, and an upper frame protects and covers the edge area of the upper surface of the bottom plate 2. Certainly, other structures, such as insertion from a side, are also possible.

In some examples, the process frame 1 has a bottom plate 4, on which the substrate 2 is laid. The process frame 1 is installed on the bottom plate 4. The bottom plate 4 and the process frame 1 comprehensively protect and cover the edge area of the substrate 2.

Figure 8:
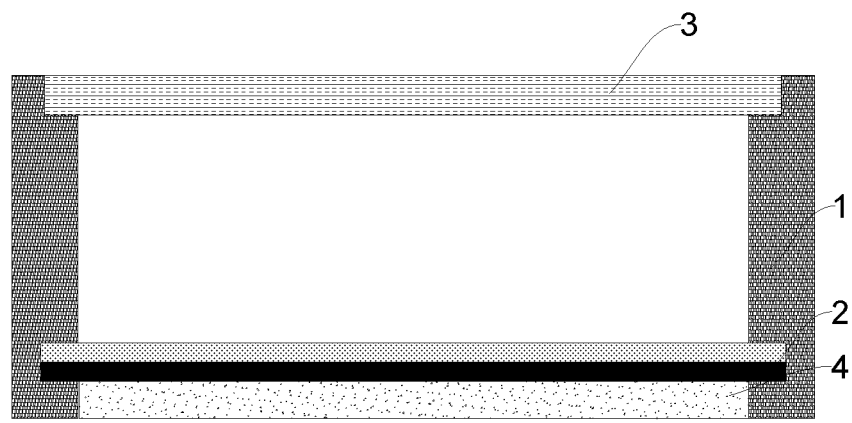
FIG. 8 is a schematic structural diagram of the bottom plate according to the present invention.
Figure 9:
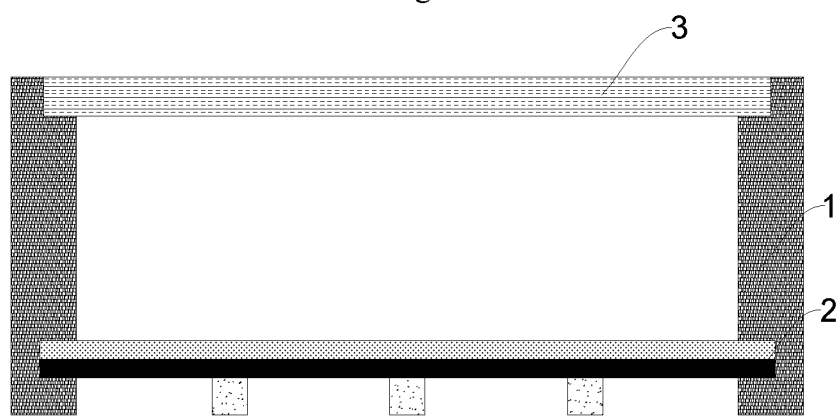
FIG. 9 is a schematic structural diagram of the bottom plate configured as support rods according to the present invention.
Figure 10:
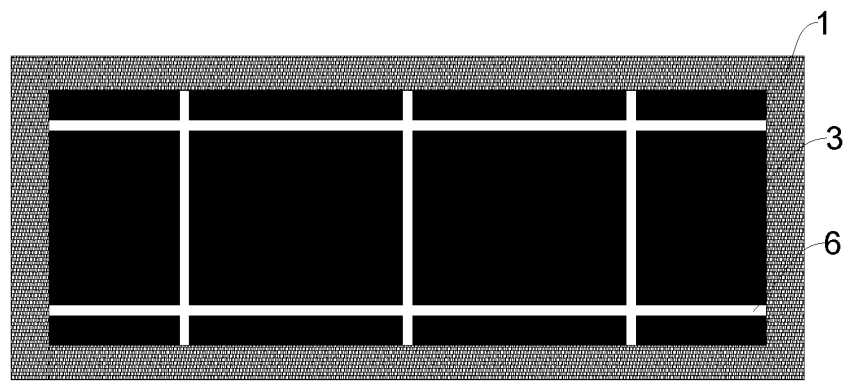
FIG. 10 is a schematic structural diagram of an external metal mesh according to the present invention.

Referring to FIGS. 8 to 10, an important aspect is the mechanical strength of the process frame 1 and the smooth storage of the substrate 2 during heating. The glass substrate 2 will be permanently bent due to elastic deformation at a high temperature. For metals, plastic deformation (translocation and grain boundaries herein) may also occur under thermal and mechanical stress (e.g., self-weight). In the above case, in some examples, the bottom plate 4 can be improved as follows.

The bottom plate 4 is supported by external rods on the load frame and the following possibilities are described for the external rods.
- the external rod is a rod having a circular or rectangular cross-section with a minimum area parallel to the foil;
- the external rods are opaque, partially transparent or fully transparent;
- the external rods are metal rods coated with graphite or carbon fiber reinforced carbon;
- the external rods are glass rods made of quartz, borosilicate glass or glass-ceramic;
- the external rods are connected by adhesives or adhesives of low-conductivity materials such as ceramic adhesives.

Certainly, the mechanical clamping film can also be used as the bottom plate of the process frame to stimulate and support the substrate.

Stimulation by an external wire mesh (with or without a bottom plate) is also allowed.

In this structure, the bottom plate 4 is composed of a plurality of support rods.

Figure 7:
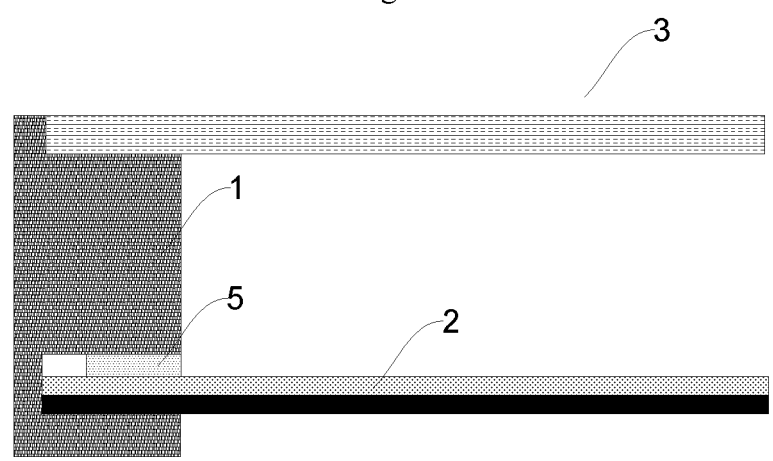
FIG. 7 is a schematic structural diagram of a gap according to the present invention.

Referring to FIG. 7, in order to ensure that the gas shielding space has good sealing performance even in the event of mechanical deformation or thermal expansion of the process frame 1, and then the size of a sealing member 5 should ensure that the gas shielding space remains in a cold state, which helps to draw away residual water vapor or oxygen. When heated, the sealing member 5 expands more than the process frame 1 and closes a gap 6 between the substrate 2 and the process frame 1.

Further, examples of material combinations for the above structure: graphite box frame (with an extension coefficient of $2 \times 10^{-6}$ $K^{-1}$) or CFK ($0.5 \times 10^{-6}$ $K^{-1}$ perpendicular to the fibers); sealing member 5: glass-ceramic with an expansion coefficient of $9 \times 10^{-6}$ $K^{-1}$, zirconium oxide ($10\text{-}13 \times 10^{-6} K^{-1}$), and magnesium oxide. The sealing member has a thickness of 5 mm, a temperature difference of 400K, and a length difference of about 0.1 mm. Considering that the steel substrate also expands with an expansion coefficient of $11\text{-}13 \times 10^{-6}$ $K^{-1}$, the width of the gap 6 in the cold state can be chosen to be slightly larger.

During the actual application, there is still some chalcogen gas remaining in the gas in the gap 6, and it is very difficult to remove the chalcogen gas remaining in the gap 6. In this case, the existing structure can be improved to automatically remove the chalcogen gas.

Figure 11:
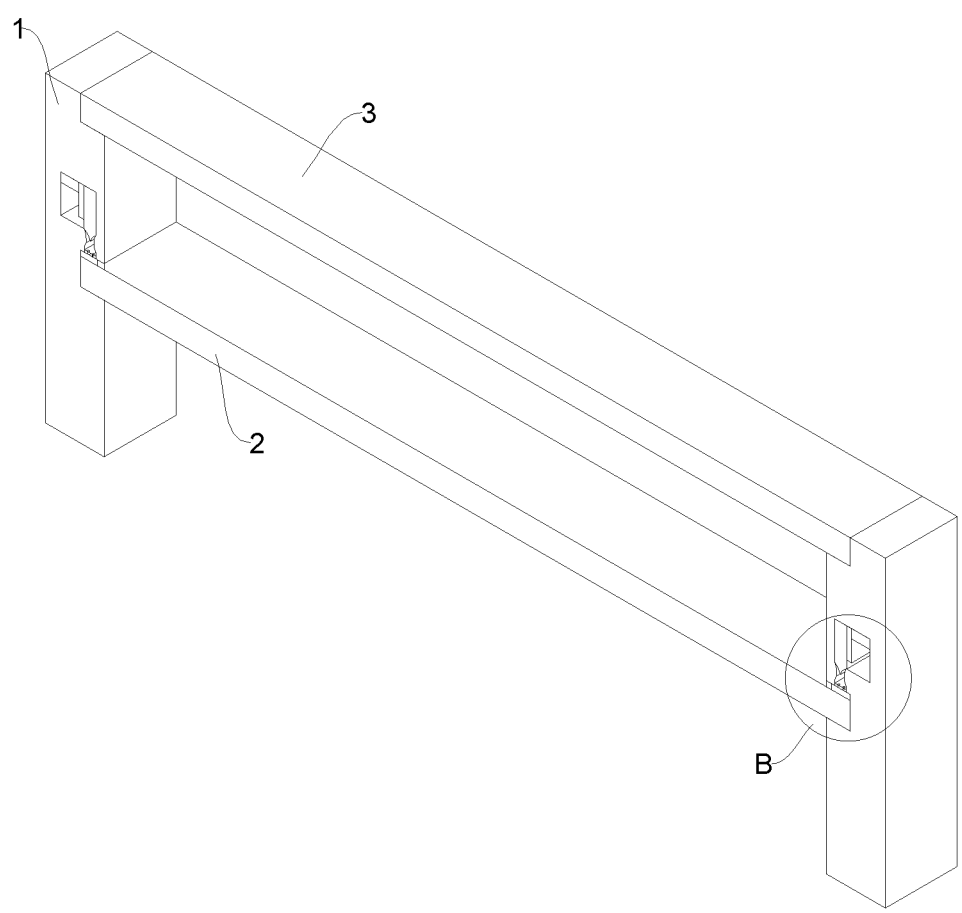
FIG. 11 is an isometric-side a schematic structural diagram of an energy-saving heat treatment device for a metal substrate in a corrosive gas.
Figure 12:
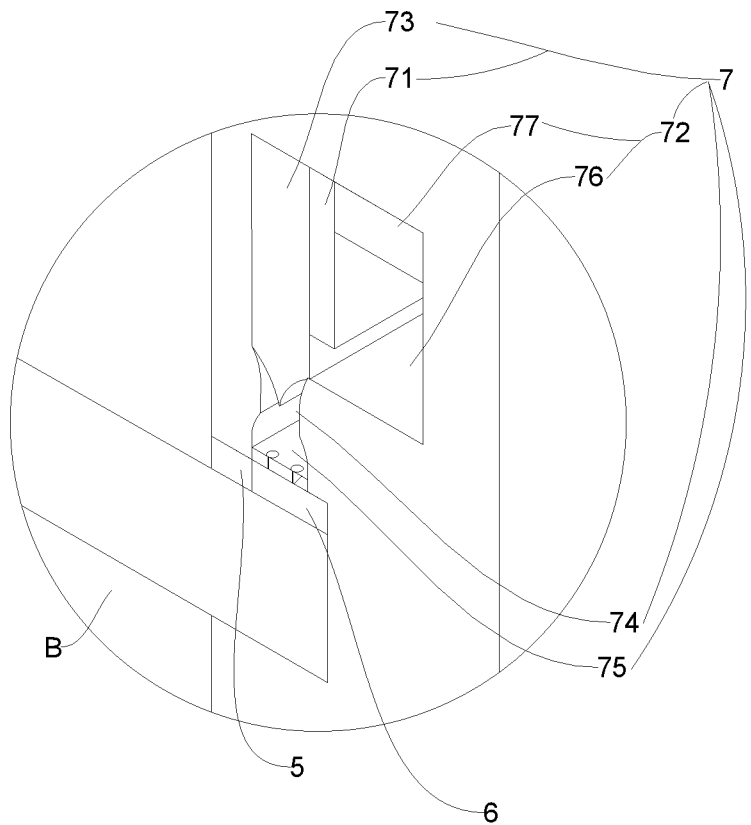
FIG. 12 is an enlarged schematic structural view of part B in FIG. 11.

In a summary of some examples, referring to FIGS. 11 and 12, a hollow body 7 is formed above or below the gap 6. The hollow body 7 is composed of an inner metal wall 71 and a cavity 72. The inner metal wall 71 is configured to conduct the heat of the radiation field and the process frame 1 to the first filler 73 and to form a desulfurization space 76. A first filler 73 shrinking with the temperature rise of the inner metal wall 71 after absorbing the heat is arranged at a connection opening between the cavity 72 and the gap 6 and shrinks along with the first filler 73 to form a gas passage 74 by which the gap 6 and the cavity 72 come into communication.

According to the present invention, the first filler 73 has a shrunken tip, and the tip of the first filler 73 is located at the connection opening. During the shrinking process, no matter whether the tip of the first filler 73 shrinks radially or laterally, the gas passage 74 can come into communication faster.

As a further improvement, ceramic fibers are used as the first filler 73, and the ceramic fiber material has excellent thermal shrinkage properties, so as to achieve the purpose of rapidly opening the gas passage 74 at a high temperature.

In some embodiments, in order to better filter the chalcogen elements in the gas, a chalcogen filtering structure is designed. Preferably, the preliminary filtering structure adopts a chalcogen filter, and the chalcogen filter is configured to filter the chalcogen elements on the gas passage 74 and is arranged on the gas passage 74 to achieve the purpose of filtering the chalcogen elements in the gas entering the cavity 72 to implement the primary filtration of the chalcogen elements. A secondary filtering structure is configured as a desulfurization space 76. The desulfurization space 76 stores desulfurization gas therein and is arranged between the cavity 72 and the inner metal wall 71. After being sucked in, gas is desulfurized by the desulfurization gas in the desulfurization space 76 to reduce the chalcogen elements in the gas in the gap 6 and the desulfurization space 76. For example, the desulfurization gas is an alkaline gas, and preferably, the alkaline gas may be ammonia gas.

In order to better push the gas from the desulfurization space 76 into the gap 6, a second filler 77 that expands as the temperature rises is configured to form, in the desulfurization space 76, a piston structure for pushing the desulfurization gas out. In this embodiment, the desulfurization space 76 is in a degassed state after being heated, so that the desulfurization gas enters the gap 6, and after the gas passage comes into communication, the desulfurization spaces 76 on two sides form a structure similar to a syringe under the action of the inner metal wall 71 and the second filler 77, so as to implement the push-out action of the desulfurization gas. In this process, by injecting desulfurization gas into the gap 6, the gas desulfurization action in the gap 6 can be completed to the maximum extent. For example, the second filler 77 includes a heat-conducting balloon and a thermally expandable fluid. Since the thermally expandable fluid is very common, it will not be described in detail herein. The heat-conducting balloon is made of a heat-resistant material. The fluid in combination with the heat-conducting balloon forms a thermal deformation structure that is likely to expand and shrink with temperature. On the one hand, the thermal deformation structure has a long service life. On the one hand, the second filler 77 is hardly damaged during thermal deformation. Certainly, the second filler can also be of a solid structure that expands by heat. Since the solid material that expands by heat is relatively common, the present invention will not describe the material in detail.

As a further improvement, a limit space for the first filler 73 to move linearly is formed between one side of the inner metal wall 71 and the inner wall of the cavity 72, and the desulfurization space 76 is located on the other side of the inner metal wall 71. Moreover, the inner metal wall 71 is an accessory with good thermal conductivity. On the one hand, during the heating process, the inner metal wall 71 can better conduct heat to the first filler 73. On the other hand, the first filler 73 and the second filler 77 are restricted to shrink in a linear direction, so as to better separate the first filler 73 from the connection opening.

As a further improvement, the gas passage 74 is sequentially provided with an inlet section, a convergent section, a throat and a diffusion section along an inlet direction to form a Venturi tube type gas passage 74 that is easy for the gas to flow into the gap 6 from the cavity 72. Utilizing the advantage of the Venturi tube structure producing little resistance to the fluid, gas can easily flow into the gap 6, and moreover blockage hardly occurs after long-term use, and thus the service life of the process frame 1 is prolonged.

In the practical application of the present invention, the bottom plate 4 is of a structure that is not easily subjected to stress and fracturing, thus ensuring the mechanical strength of the bottom plate 4. The present invention makes the following improvements to the bottom plate 4.

Figure 13:
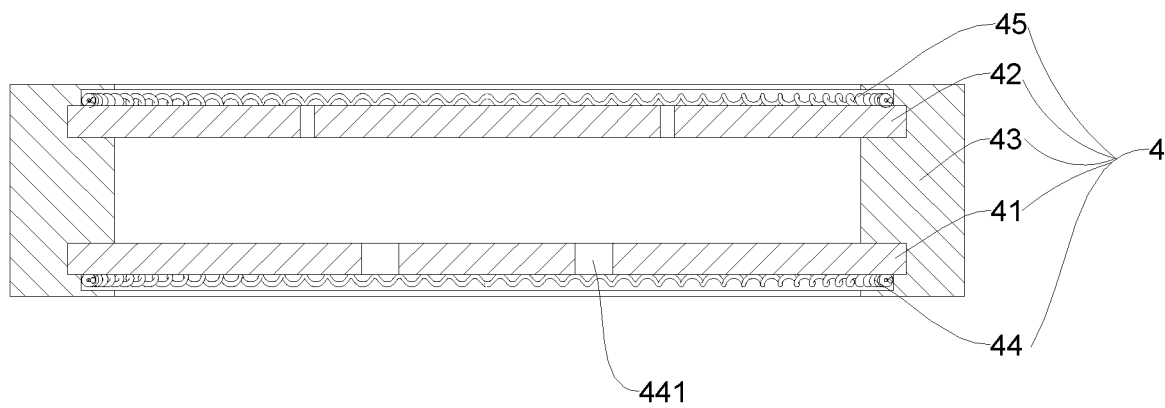
FIG. 13 is a schematic structural diagram of the bottom plate according to the present invention.

Referring to FIG. 13, the bottom plate 4 includes: a first transmission plate 41, a second transmission plate 42, a spacer 43, a first spring 44, and a second spring 45. In a specific application, the spacer 43 may be a part of the process frame 1. The spacer 43 is configured to separate the first transmission plate 41 from the second transmission plate 42 and arranged on a peripheral edge of the first transmission plate 41 and a peripheral edge of the second transmission plate 42. The first spring 44 is arranged between a bottom surface of the first transmission plate 41 and the spacer 43 to form a first expansion space. The second spring 45 is arranged between a top surface of the second transmission plate 42 and the spacer 43 to form a second expansion space. Specifically, the first spring 44 is located at a position adjacent to the peripheral edge of the first transmission plate 41, and the second spring 45 is located at a position adjacent to the peripheral edge of the second transmission plate 42.

Due to use of the first spring 44 and the second spring 45, an expansion space is formed between the first transmission plate 41 and the spacer 43 and between the second transmission plate 42 and the spacer 43, so as to prevent the thermally expanded first transmission plate 41 or second transmission plate 42 from fracturing due to the narrowed space.

In a specific embodiment of the present disclosure, each of the first spring 44 and the second spring 45 includes a superalloy. For example, the superalloy includes cobalt, chromium, nickel, and molybdenum. The superalloy is selected because the superalloy is non-magnetic, presents high strength, and maintains excellent formability, excellent corrosion resistance and high fatigue strength. On the one hand, the chalcogenide gas can be prevented from corroding the two springs in the expansion spaces. On the other hand, since the service life of the superalloy is relatively long, the actual service life of the bottom plate 4 is prolonged.

In some embodiments, the first spring 44 includes a coil spring, and the coil spring is in contact with the bottom surface of the first transmission plate 41 adjacent to the peripheral edge of the first transmission plate 41; the second spring 45 includes a coil spring, and the coil spring is in contact with the top surface of the second transmission plate 42 adjacent to the peripheral edge of the second transmission plate 42.

As a further improvement, the first transmission plate 41 and the second transmission plate 42 are each provided with a plurality of vent holes 411 for gas to pass into the gas storage space.

The embodiments mentioned above are merely preferred embodiments of the invention and not intended to limit the invention. Any of modifications, equivalent substitutions, improvements, and the like made within the spirit and principle of the invention shall be covered in the protection scope of the invention.

What is claimed is:

1. An energy-saving heat treatment device for a metal substrate in a corrosive gas, comprising:
   a process chamber;
   a radiation field, arranged in a process space to provide a heat source for the process space;
   a process frame, arranged inside the process space to accommodate at least one substrate to carry out a rapid heat treatment process, an upper surface of an outer edge of the substrate being covered on the process frame; and
   a cover, covering a top of the process frame to isolate a space above the substrate from the process chamber;
   wherein the process frame, the substrate and the cover form a small process volume, and the small process volume reduces an amount of introduction and/or overflow of a process gas exchanged with the process chamber to a limit value;
   the cover is configured as:
   1) being located inside the radiation field and remains stationary; or
   2) being located on the process frame and forming an integral structure with the process frame;
   an outer edge of a lower surface of the substrate is covered by two methods:
   mode I): the process frame covers the outer edge of the lower surface of the substrate; or
   mode II) the substrate is in contact with a bottom surface of the radiation field so that the bottom surface of the radiation field covers a bottom surface of the substrate;
   the cover is located between two outer edges of the substrate, a covering area of the cover is within a range of 1 to 50 mm, and the cover is provided with a photoelectrically inert material;
   a bottom plate is arranged under the substrate in two forms:

form a): the bottom plate supports the substrate and is located at a bottom end of the process frame and forms an integral structure with the process frame; and form b): the bottom plate supports the substrate and is installed on the bottom surface of the radiation field; and a sealing member for sealing an upper surface and/or a lower surface of the outer edge of the substrate is arranged in the outer edge of the substrate.

2. The energy-saving heat treatment device for the metal substrate in the corrosive gas according to claim 1, wherein the sealing member comprises a material having a longitudinal expansion coefficient greater than that of the process frame, and the sealing member, the process frame and the substrate form a gap in a cold state.

3. The energy-saving heat treatment device for the metal substrate in the corrosive gas according to claim 2, wherein the sealing member comprises at least one or a combination of glass-ceramic, zirconia and magnesia.

4. The energy-saving heat treatment device for the metal substrate in the corrosive gas according to claim 3, wherein a metal wire mesh is arranged on the lower surface of the substrate and substantially parallel to the substrate.

5. The energy-saving heat treatment device for the metal substrate in the corrosive gas according to claim 4, wherein the bottom plate comprises at least one support rod.

6. The energy-saving heat treatment device for the metal substrate in the corrosive gas according to claim 4, wherein the bottom plate comprises:
    a first transmission plate;
    a second transmission plate;
    a spacer, configured to separate the first transmission plate from the second transmission plate and arranged on a peripheral edge of the first transmission plate and a peripheral edge of the second transmission plate;
    a first spring, arranged between a bottom surface of the first transmission plate and the spacer; and
    a second spring, arranged between a top surface of the second transmission plate and the spacer.

7. The energy-saving heat treatment device for the metal substrate in the corrosive gas according to claim 6, wherein the first spring is located at a position adjacent to the peripheral edge of the first transmission plate, and the second spring is located at a position adjacent to the peripheral edge of the second transmission plate.

8. The energy-saving heat treatment device for the metal substrate in the corrosive gas according to claim 7, wherein each of the first spring and the second spring comprises a superalloy; wherein the superalloy comprises cobalt, chromium, nickel, and molybdenum.

9. The energy-saving heat treatment device for the metal substrate in the corrosive gas according to claim 8, wherein the first transmission plate is provided with a plurality of vent holes for gas to pass.

10. The energy-saving heat treatment device for the metal substrate in the corrosive gas according to claim 8, wherein the first spring comprises a coil spring, and the coil spring is in contact with the bottom surface of the first transmission plate adjacent to the peripheral edge of the first transmission plate; the second spring comprises a coil spring, and the coil spring is in contact with the top surface of the second transfer plate adjacent to the peripheral edge of the second transmission plate.

11. The energy-saving heat treatment device for the metal substrate in the corrosive gas according to claim 10, wherein the gap comprises:
    a hollow body, positioned on a top surface and/or a bottom surface of the gap, the hollow body being implemented as an inner metal wall and a cavity, a first filler being arranged to block a connection opening between the cavity and the gap in the cavity, the first filler shrinking and opening the connection opening as the temperature rises.

12. The energy-saving heat treatment device for the metal substrate in the corrosive gas according to claim 11, wherein the first filler has a shrunken tip, and the shrunken tip of the first filler is located at the connection opening.

13. The energy-saving heat treatment device for the metal substrate in the corrosive gas according to claim 12, wherein the first filler comprises ceramic fibers.

14. The energy-saving heat treatment device for the metal substrate in the corrosive gas according to claim 13, wherein a chalcogenide filter is configured at the connection opening.

15. The energy-saving heat treatment device for the metal substrate in the corrosive gas according to claim 14, wherein the cavity is provided with a desulfurization space for storing a desulfurization gas.

16. The energy-saving heat treatment device for the metal substrate in the corrosive gas according to claim 15, wherein the desulfurization gas comprises an alkaline gas.

17. The energy-saving heat treatment device for the metal substrate in the corrosive gas according to claim 16, wherein a stopper is arranged between the first filler and the cavity.

18. The energy-saving heat treatment device for the metal substrate in the corrosive gas according to claim 17, wherein a second filler is configured in the desulfurization space, the second filler expanding as the temperature rises, so as to form a piston structure for pushing the desulfurization gas out.

19. The energy-saving heat treatment device for the metal substrate in the corrosive gas according to claim 18, wherein the connection opening is sequentially provided with an inlet section, a convergent section, a throat and a diffusion section along an inlet direction to form a Venturi tube type gas passage that is easy for the gas to flow into the gap from the cavity.

20. The energy-saving heat treatment device for the metal substrate in the corrosive gas according to claim 18, wherein the second filler comprises a heat-conducting balloon and a thermally expandable fluid.

* * * * *